United States Patent
Huott et al.

(10) Patent No.: US 9,557,381 B1
(45) Date of Patent: Jan. 31, 2017

(54) PHYSICALLY AWARE INSERTION OF DIAGNOSTIC CIRCUIT ELEMENTS

(71) Applicant: INTERNATIONAL BUSINESS MACHINES CORPORATION, Armonk, NY (US)

(72) Inventors: William V. Huott, Holmes, NY (US); Mary P. Kusko, Hopewell Junction, NY (US); Sridhar H. Rangarajan, Bangalore (IN); Robert C. Redburn, Fishkill, NY (US); Andrew A. Turner, Milton, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/987,824

(22) Filed: Jan. 5, 2016

(51) Int. Cl.
*G01R 31/3185* (2006.01)
*G01R 31/3183* (2006.01)
*G01R 31/3177* (2006.01)

(52) U.S. Cl.
CPC ... *G01R 31/3177* (2013.01); *G01R 31/318335* (2013.01); *G01R 31/318536* (2013.01); *G01R 31/318541* (2013.01); *G01R 31/318563* (2013.01); *G01R 31/318572* (2013.01)

(58) Field of Classification Search
CPC .............. G01R 31/318547; G01R 31/318335; G01R 31/318536; G01R 31/318572; G01R 31/318541; G01R 31/318563
USPC ......................................................... 714/726
See application file for complete search history.

(56) References Cited

U.S. PATENT DOCUMENTS

| | | | |
|---|---|---|---|
| 5,748,497 A * | 5/1998 | Scott | G01R 31/318378 702/123 |
| 5,881,067 A | 3/1999 | Narayanan et al. | |
| 6,370,664 B1 * | 4/2002 | Bhawmik | G01R 31/318586 714/726 |
| 6,615,380 B1 | 9/2003 | Kapur et al. | |
| 6,681,356 B1 | 1/2004 | Gerowitz et al. | |
| 6,986,090 B2 | 1/2006 | Hathaway et al. | |
| 7,139,950 B2 | 11/2006 | Huisman et al. | |
| 7,181,664 B2 | 2/2007 | Lee et al. | |
| 7,188,323 B2 | 3/2007 | Wang et al. | |
| 7,263,641 B2 * | 8/2007 | Rajski | G01R 31/31813 714/727 |
| 7,376,915 B1 | 5/2008 | Duewer et al. | |
| 7,412,636 B2 * | 8/2008 | Cooke | G01R 31/318547 714/726 |

(Continued)

*Primary Examiner* — James C Kerveros
(74) *Attorney, Agent, or Firm* — Cantor Colburn LLP; Steven Meyers

(57) ABSTRACT

According to an embodiment of the present invention, a computer-implemented method for inserting diagnostic circuit elements in a scan chain of a chip may include creating, via a processor, a segment for each latch of a plurality of latches in the scan chain to create a plurality of adjacent and connected segments, merging, via the processor, the two adjacent and connected segments to form a super-segment comprising all latches contained in the two adjacent and connected segments based on the objective function, and inserting, via the processor, a logic circuit element between the super-segment and a segment that is adjacent and connected to the super-segment in the scan chain, where the logic circuit element allows diagnostic isolation of the scan chain super-segment.

18 Claims, 11 Drawing Sheets

(56) References Cited

U.S. PATENT DOCUMENTS

| | | | |
|---|---|---|---|
| 7,461,307 B2 * | 12/2008 | Gunda | G01R 31/318541 |
| | | | 714/726 |
| 7,729,884 B2 * | 6/2010 | Huang | G01R 31/318547 |
| | | | 702/185 |
| 7,752,515 B2 * | 7/2010 | Dervisoglu | G01R 31/318335 |
| | | | 714/728 |
| 7,900,103 B2 | 3/2011 | Casarsa | |
| 7,954,025 B2 | 5/2011 | Shrivastava | |
| 7,958,472 B2 | 6/2011 | Wohl et al. | |
| 7,996,800 B2 | 8/2011 | Baumgarter et al. | |
| 7,996,805 B2 | 8/2011 | Pasqualini | |
| 8,443,326 B1 | 5/2013 | Gupta et al. | |
| 8,782,591 B1 | 7/2014 | Ku et al. | |
| 2003/0005363 A1 | 1/2003 | Bassett | |
| 2005/0210349 A1 * | 9/2005 | Lambert | G01R 31/318563 |
| | | | 714/726 |
| 2009/0288045 A1 | 11/2009 | Chien et al. | |
| 2012/0030532 A1 * | 2/2012 | Jain | G01R 31/318547 |
| | | | 714/726 |

* cited by examiner

PHYSICALLY AWARE INSERTION OF DIAGNOSTIC CIRCUIT ELEMENTS

BACKGROUND

The present disclosure relates to diagnostic circuit elements, and more specifically, to physically aware insertion of diagnostic circuit elements.

In prior generation microprocessors, circuit elements for the purposes of diagnosing chip failures (such as XOR's in scan chains) were inserted with no consideration of physical layout properties. The result was poor spatial resolution for failure analysis, which made root cause defect identification difficult and time consuming due to large inspection areas. For example, as seen in FIG. 1, a graph of area insertion mean segment length and area is shown, according to conventional methods. The area insertion mean is depicted as a function of XOR frequency. Generally speaking, the size of the circle depicted in FIG. 1 represents how compact the circuits are in the layout. The large circle 1102 in the plot represents actual insertion properties for a 22 nm microprocessor product. The small circle 11 identifies an average logical resolution (y-axis) of ~20 circuits while the diameter of large circle 1102 is proportional to the average spatial resolution of chip circuit elements. The logical resolution is the average number of devices that a diagnostic element can identify. For example, as shown in the graph of FIG. 1, for every one element inserted, about twenty normal circuits are identified. While a logical resolution of 20 circuit elements may be acceptable, the spatial resolution can make circuit analysis labor intense, time consuming, and costly.

The placement of diagnostic elements into scan chains can affect a great number of things, including chip failure analysis, circuit power analysis and management, and extrapolation of relevant scan chain diagnosis information from a limited circuit sample. Current diagnostic methods may include blind placement or singular-ruled placement of diagnostic circuit elements, and may not provide a clear metric having a broad set of rules that may be applicable when determining where diagnostic circuit elements should be placed.

SUMMARY

According to an embodiment of the present invention, a computer-implemented method for inserting diagnostic circuit elements in a scan chain of a chip is described. The method may include creating, via a processor, a segment for each latch of a plurality of latches in the scan chain to create a plurality of adjacent and connected segments, merging, via the processor, the two adjacent and connected segments to form a super-segment comprising all latches contained in the two adjacent and connected segments based on the objective function, and inserting, via the processor, a logic circuit element between the super-segment and a segment that is adjacent and connected to the super-segment in the scan chain, where the logic circuit element allows diagnostic isolation of the scan chain super-segment.

According to other embodiments, a system for inserting diagnostic circuit elements in a scan chain of a chip is described. The system may include a processor configured to create a segment for each latch of a plurality of latches in the scan chain to create a plurality of adjacent and connected segments, merge the two adjacent and connected segments to form a super-segment comprising all latches contained in the two adjacent and connected segments, and insert a logic circuit element between the super-segment and a segment that is adjacent and connected to the super-segment in the scan chain, where the logic circuit element allows diagnostic isolation of a scan chain super-segment.

According to yet other embodiments, a non-transitory computer-readable storage medium is described. The non-transitory computer-readable storage medium may include program instructions that are executable by a processor to perform a method for inserting diagnostic circuit elements in a scan chain of a chip. The method may include creating, via a processor, a segment for each latch of a plurality of latches in the scan chain to create a plurality of adjacent and connected segments, merging, via the processor, the two adjacent and connected segments to form a super-segment comprising all latches contained in the two adjacent and connected segments based on the objective function, and inserting, via the processor, a logic circuit element between the super-segment and a segment that is adjacent and connected to the super-segment in the scan chain, where the logic circuit element allows diagnostic isolation of the scan chain super-segment.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 2:
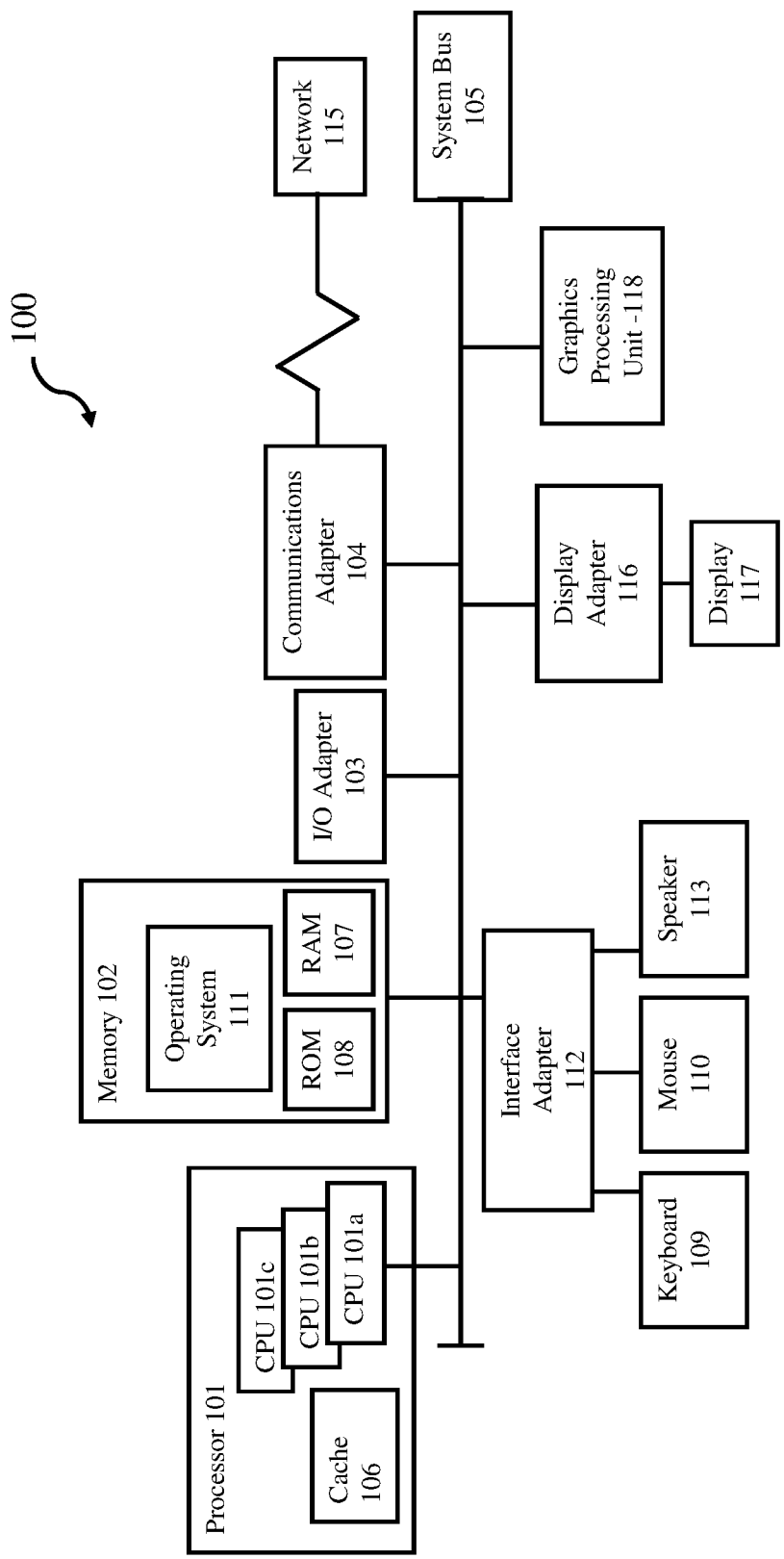
FIG. 2 illustrates a block diagram of a computer system for use in practicing the teachings herein.

FIG. 2 illustrates a block diagram of a computer system 100 (hereafter "computer 100") for use in practicing the embodiments described herein. The methods described herein can be implemented in hardware, software (e.g., firmware), or a combination thereof. In an exemplary embodiment, the methods described herein are implemented in hardware, and may be part of the microprocessor of a special or general-purpose digital computer, such as a personal computer, workstation, minicomputer, or mainframe computer. Computer 100 therefore can embody a general-purpose computer. In another exemplary embodiment, the methods described herein are implemented as part of a mobile device, such as, for example, a mobile phone, a personal data assistant (PDA), a tablet computer, etc.

Figure 1:
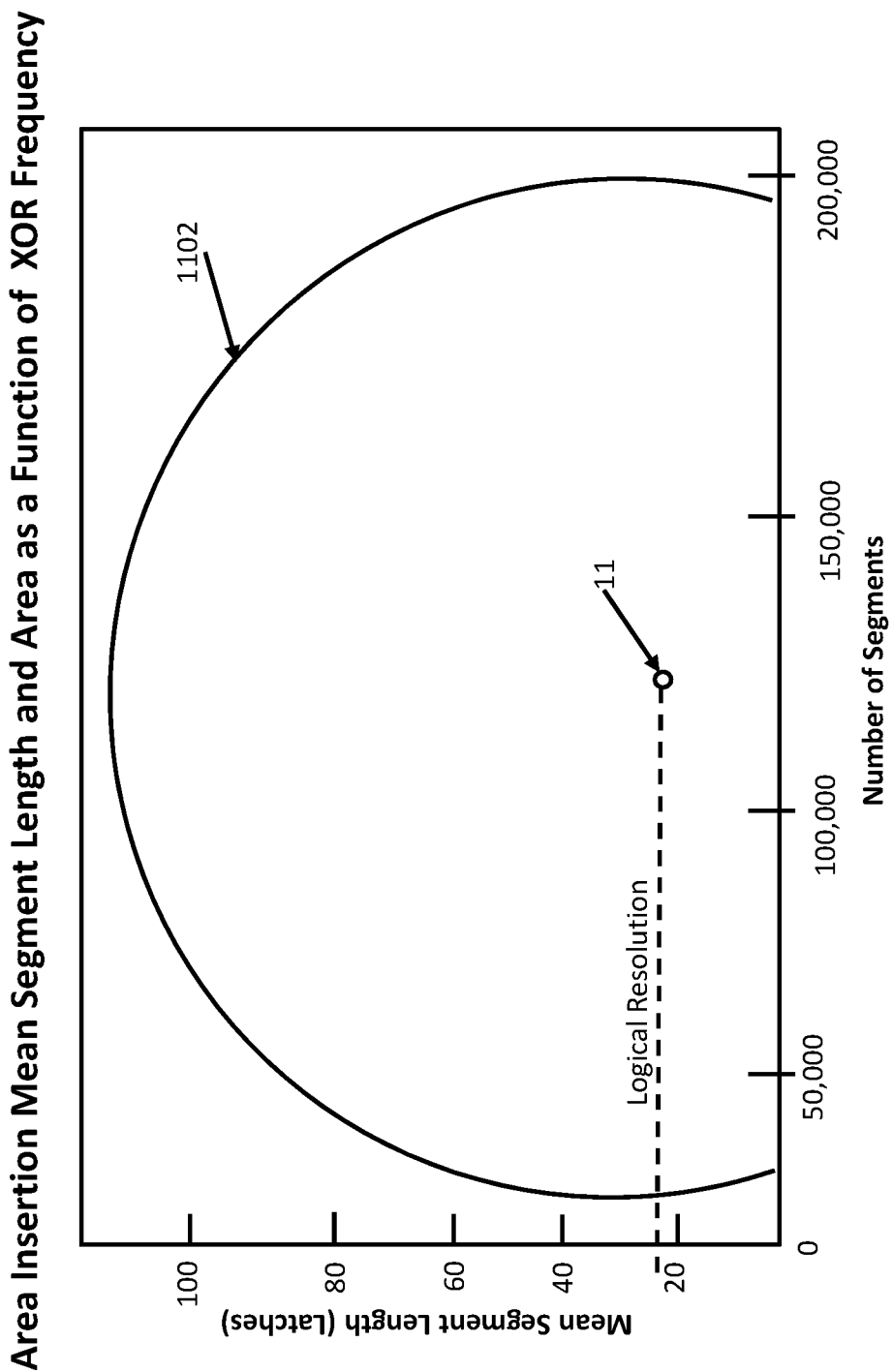
FIG. 1 is a graph of area insertion mean segment length and area as a function of XOR frequency, according to known methods.

In an exemplary embodiment, in terms of hardware architecture, as shown in FIG. 1, the computer 100 includes processor 101. Computer 100 also includes memory 102 coupled to processor 101, and one or more input/output adaptors 103, that may be communicatively coupled via system bus 105. Memory 102 may be operatively coupled to one or more internal or external memory devices. Communications adaptor 104 may be operatively connect computer 100 to one or more networks 115. A system bus 105 may also connect one or more user interfaces via interface adaptor 112. Interface adaptor 112 may connect a plurality of user interfaces to computer 100 including, for example, keyboard 109, mouse 110, speaker 113, etc. System bus 105 may also connect display adaptor 116 and display 117 to processor 101. Processor 101 may also be operatively connected to graphical processing unit 118.

Processor 101 is a hardware device for executing hardware instructions or software, particularly that stored in a non-transitory computer-readable memory (e.g., memory 102). Processor 101 can be any custom made or commercially available processor, a central processing unit (CPU), a plurality of CPUs, for example, CPU 101a-101c, an auxiliary processor among several other processors associated with the computer 100, a semiconductor based microprocessor (in the form of a microchip or chip set), or generally any device for executing instructions. Processor 101 can include a memory cache 106, which may include, but is not limited to, an instruction cache to speed up executable instruction fetch, a data cache to speed up data fetch and store, and a translation lookaside buffer (TLB) used to speed up virtual-to-physical address translation for both executable instructions and data. Cache 106 may be organized as a hierarchy of more cache levels (L1, L2, etc.).

Memory 102 can include random access memory (RAM) 107 and read only memory (ROM) 108. RAM 107 can be any one or combination of volatile memory elements (e.g., DRAM, SRAM, SDRAM, etc.). ROM 108 can include any one or more nonvolatile memory elements (e.g., erasable programmable read only memory (EPROM), flash memory, electronically erasable programmable read only memory (EEPROM), programmable read only memory (PROM), tape, compact disc read only memory (CD-ROM), disk, cartridge, cassette or the like, etc.). Moreover, memory 102 may incorporate electronic, magnetic, optical, and/or other types of non-transitory computer-readable storage media. Note that the memory 102 can have a distributed architecture, where various components are situated remote from one another, but can be accessed by the processor 101.

The instructions in memory 102 may include one or more separate programs, each of which comprises an ordered listing of computer-executable instructions for implementing logical functions. In the example of FIG. 2, the instructions in memory 102 may include an operating system 111. Operating system 111 can control the execution of other computer programs and provides scheduling, input-output control, file and data management, memory management, and communication control and related services.

Input/output adaptor 103 can be, for example but not limited to, one or more buses or other wired or wireless connections, as is known in the art. Input/output adaptor 103 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

Interface adaptor 112 may be configured to operatively connect one or more input/output (I/O) devices to computer 100. For example, interface adaptor 112 may connect a keyboard 109 and mouse 110. Other output devices, e.g., speaker 113 may be operatively connected to interface adaptor 112. Other output devices may also be included, although not shown. For example, devices may include but are not limited to a printer, a scanner, microphone, and/or the like. Finally, the I/O devices connectable to interface adaptor 112 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like.

Computer 100 can further include display adaptor 116 coupled to one or more displays 117. In an exemplary embodiment, computer 100 can further include communications adaptor 104 for coupling to a network 115.

Network 115 can be an IP-based network for communication between computer 100 and any external device. Network 115 transmits and receives data between computer 100 and devices and/or systems external to computer 100. In an exemplary embodiment, network 115 can be a managed IP network administered by a service provider. Network 115 may be a network internal to an aircraft, such as, for example, an avionics network, etc. Network 115 may be implemented in a wireless fashion, e.g., using wireless protocols and technologies, such as WiFi, WiMax, etc. Network 115 may also be a wired network, e.g., an Ethernet network, an ARINC 429 network, a CAN, etc., having any wired connectivity including, e.g., an RS232 connection, R5422 connection, etc. Network 115 can also be a packet-switched network such as a local area network, wide area network, metropolitan area network, Internet network, or other similar type of network environment. The network 115 may be a fixed wireless network, a wireless local area network (LAN), a wireless wide area network (WAN) a personal area network (PAN), a virtual private network (VPN), intranet or other suitable network system.

If computer 100 is a PC, workstation, laptop, tablet computer and/or the like, the instructions in the memory 102 may further include a basic input output system (BIOS) (omitted for simplicity). The BIOS is a set of essential routines that initialize and test hardware at startup, start operating system 111, and support the transfer of data among the operatively connected hardware devices. The BIOS is stored in ROM 108 so that the BIOS can be executed when computer 100 is activated. When computer 100 is in operation, processor 101 may be configured to execute instructions stored within the memory 102, to communicate data to and from the memory 102, and to generally control operations of the computer 100 pursuant to the instructions.

Figure 3:
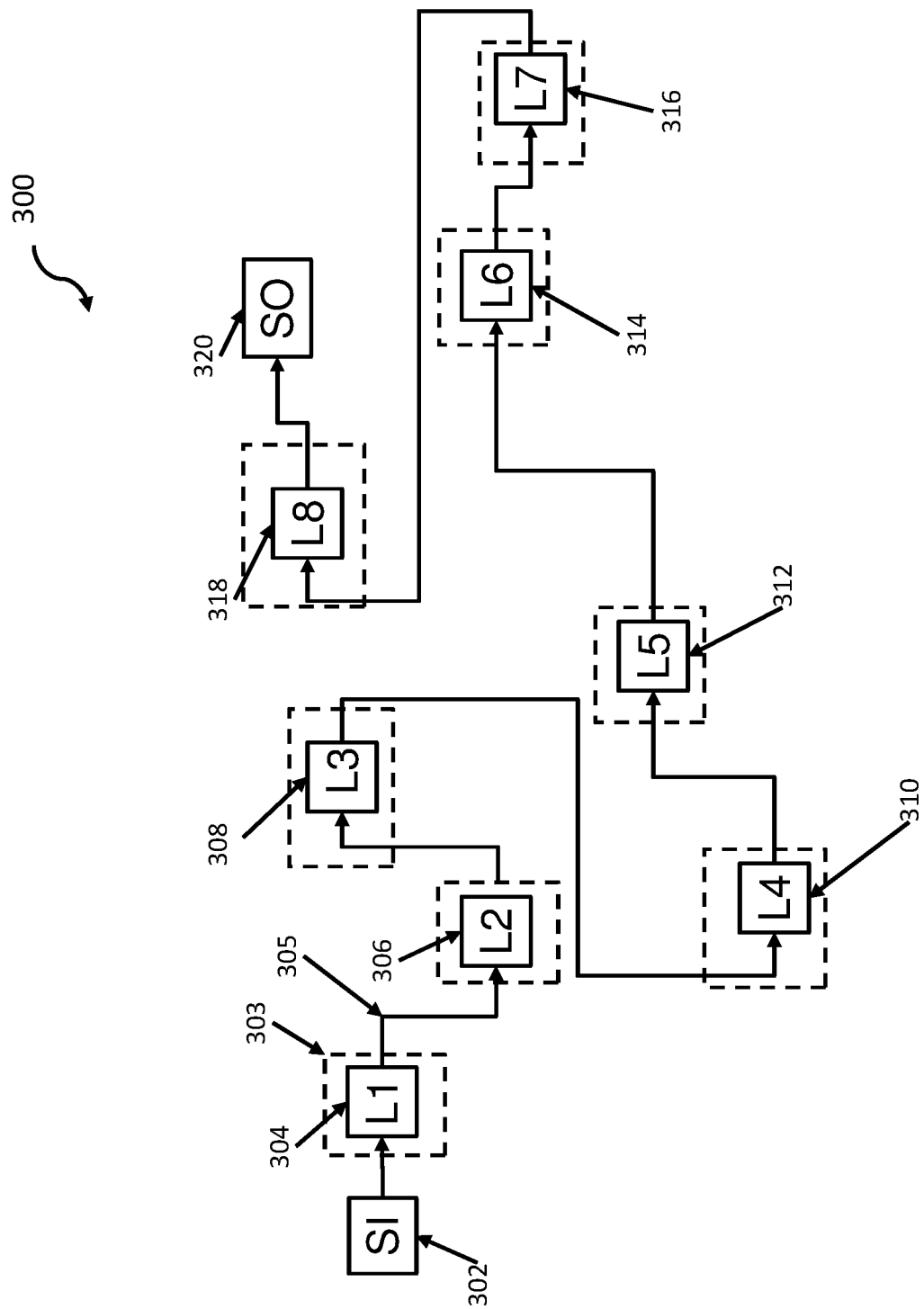
FIG. 3 depicts a block diagram of a scan chain in accordance with an exemplary embodiment.

FIG. 3 depicts a block diagram of a scan chain, in accordance with an exemplary embodiment. Referring now to FIG. 3, exemplary scan chain 300 is depicted. Scan chain 300 is shown with a scan input pin 302, a scan output pin 320, and a plurality of latches 304-318. Each of latches 304-318 may be connected to an adjacent latch by a connecting wire 305. It is notable that the shape of scan chain 300 is arbitrarily non-linear to represent an example shape of a scan chain on a physical chip, as implemented in practice. In most instances, the scan chain can span very small distances between latches to relatively long distances that span most of or all of the width of the physical chip. It should be appreciated that the shape of scan chain 300 and the number of latches 304-318 are arbitrary and may be configured with any number of shapes and latches.

Current methods for diagnosing physical or logical issues in scan chains may include physically inserting logic circuits to isolate segments of scan chains. Circuit elements (e.g., MUXs, and-or-invert (AOI) circuits, XORs, etc.) may be inserted between latches (to form scan chain segments) for the purposes of diagnosing chip failures.

These diagnostic circuit elements are often inserted into scan chains with no consideration of physical layout properties. This practice has resulted in poor spatial resolution for failure analysis making root cause defect identification difficult and time consuming due to large inspection areas. For example, scan chain 300 may include up to 20 latches (although 8 are shown in FIG. 3 for simplicity). Current diagnostic methods may include blind placement or singular-ruled placement of diagnostic circuit elements. In some instances, current methods may not provide a clear metric having a broad set of rules that may be applicable when determining where diagnostic circuit elements should be placed. Since scan chains are connected serially, when one portion of the scan chain experiences a defect or malfunction, a technician must inspect each element (e.g., each of latches 304-318), and the entire length of wire (e.g., connecting wire 305) that connects each adjacent latch. Because scan chains may not be laid out on a physical chip in a succinct (physically close) layout, a physical failure analysis (PFA) engineering technician must sometimes inspect large portions of a chip, including the physical connecting wire 305, in order to ascertain the exact location of the defect.

To make the inspection simpler, in an ideal scenario, each latch in scan chain 300 would have a logic circuit separating it from each successive latch. Accordingly, if one latch or connecting wire (e.g., connecting wire 305 separating virtual segments/latches L1 303 and L2 306) contained a defect, the intervening logic circuit (not shown) could identify the exact location of the defect. For example, in an ideal embodiment, latch L1 304 would ideally be segmented into its own virtual segment 303. Scan chain 300 is depicted with the latches having virtual segments of a single latch, as illustrated by the dashed lines surrounding each of latches 304-318. Although the insertion of a logic circuit between each latch would create perfect diagnosability, the practice is not currently practical for many reasons, including space limitations, cost, chip size, etc. Accordingly, it may be advantageous to group adjacent latches together in an intelligent way to form super-segments, where the placement of a diagnostic circuit element between super-segments can optimize the analysis and trouble-shooting of chip logic errors by reducing the physical area that a PFA technician must analyze to determine a cause of the error.

Figure 4:
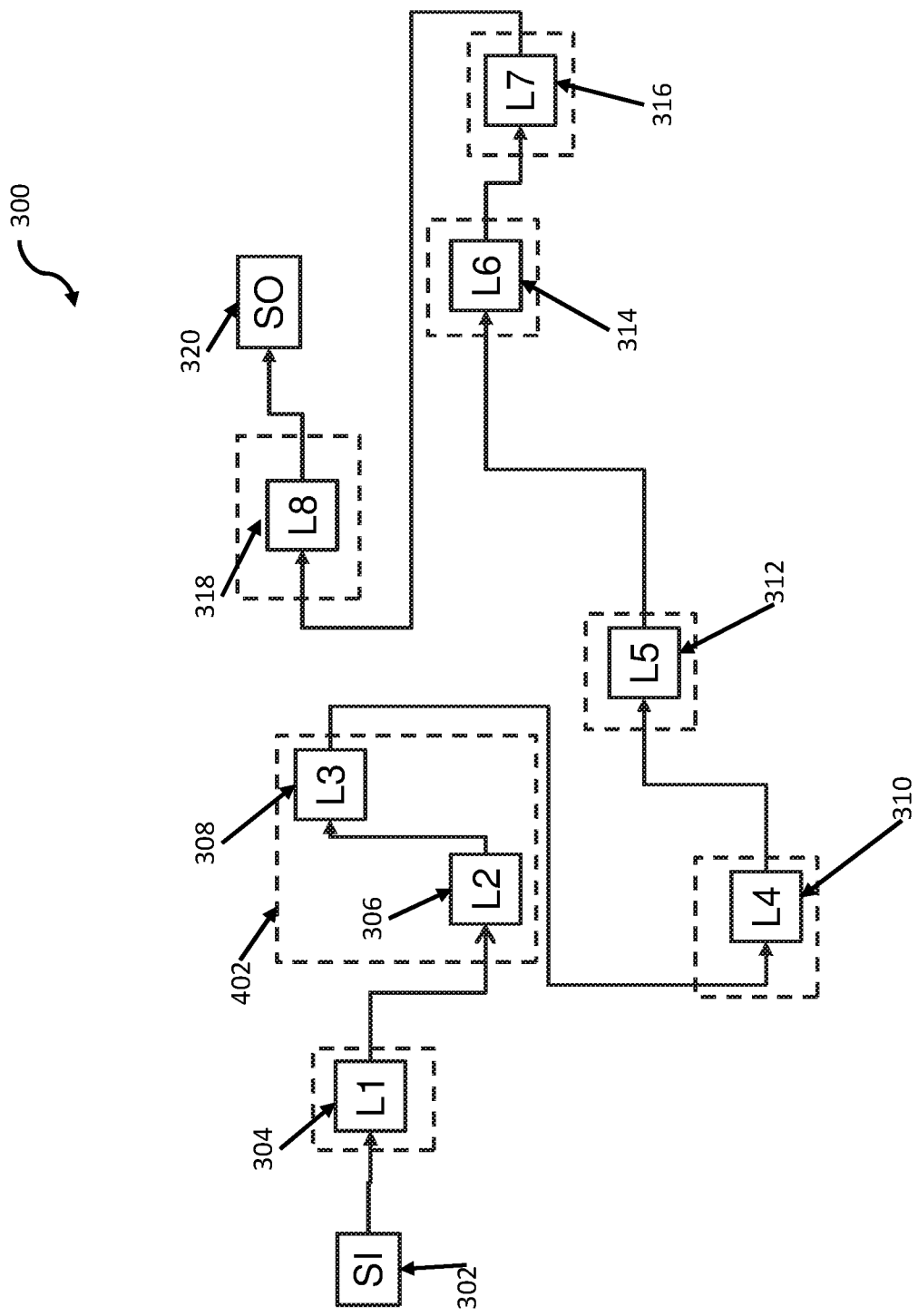
FIG. 4 depicts a block diagram of physically aware insertion of diagnostic circuit elements in the scan chain of FIG. 3 in accordance with an exemplary embodiment.

FIG. 4 depicts a block diagram of physically aware insertion of diagnostic circuit elements in scan chain 300, in accordance with an exemplary embodiment. Although the primary function of some embodiments may be to reduce a total segment (thereby reducing the area for a PFA to analyze in connection with a logic error), other objectives are contemplated. For example, another objective may be grouping together particular latch design types (e.g., it may be advantageous to cluster nlats vs slats vs. eslats). As another example, an objective function may include grouping together timing elements (thereby clustering circuit elements with a predetermined timing). According to other embodiments, an objective function may include grouping latches having a maximum or minimum connecting wire length between latches. In yet other embodiments, an objective function may be based on a total iteration count (e.g., processor 101 may stop after a predetermined number of iterations). In other aspects, an objective function may be based on a cell count. Other embodiments may include grouping scan chain elements according to the connectivity to specific elements (e.g., grouping elements connected to particular LCB clusters), etc. Regardless of the particular objective function, processor 101 may meet an objective function, by intelligently grouping together scan chain segments and placing physical (real) circuit elements between the optimized super-segments.

Referring now to FIG. 4, in some embodiments, processor 101 may create a virtual segment for each latch of a plurality of latches in the scan chain to create a plurality of adjacent and connected segments. In some aspects, processor 101 may group together adjacent latches to form one or more super-segments meeting an objective of having minimal combined bounding area (which would optimize the area for each segment separated by diagnostic circuit element that allows diagnostic isolation of the scan chain super-segment). Accordingly, processor 101 may place a virtual diagnostic circuit element (e.g., virtual segment 303) between two adjacent latches. With a virtual diagnostic circuit element between each of the latches (the ideal scenario), processor 101 may work backward to analyze the entire scan chain 300 and find the optimal configuration for grouping each of the virtual segments into actual super-segments.

Accordingly, processor 101 may analyze all of latches 304-318 and determine at least two latches (e.g., latches L2 306 and L3 308) that may satisfy the objective of minimizing the combined bounding area. For example, processor 101 may examine the relative distances between each of latches 304-320 and calculate a distance between all segments (L1 to L2, L2 to L3, etc.). If the objective function is to minimize bounding area, processor 101 may determine that the smallest distances between elements exists between latches L2 306 and L3 308. Processor 101 may next remove a (virtual) diagnostic element intervening latches L2 306 and L3 308, and combine latch L2 306 and latch L3 308 to form a 2-latch super-segment 402. As described herein, any segment made to include two or more latches (with an algorithm described herein) can be referred to as a super-segment.

Accordingly, processor 101 may remove a virtual diagnostic circuit element separating latch L2 306 and latch L3 308 based on a determination that this latch group (in this case, a pair of latches) may have the smallest possible area left over once the intervening (virtual) diagnostic circuit element is removed, and a super-segment 402 is formed.

Figure 5:
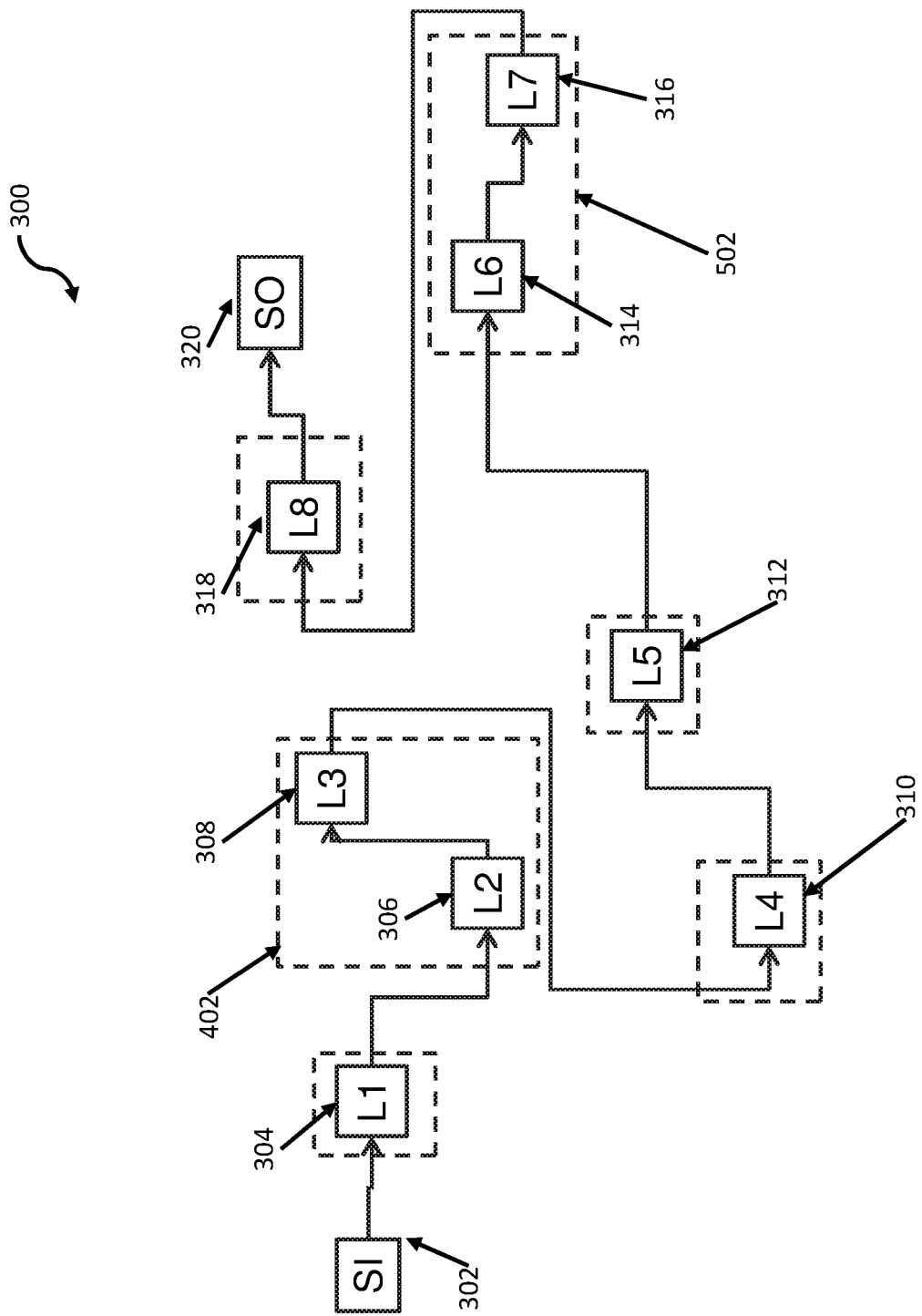
FIG. 5 depicts a block diagram of physically aware insertion of diagnostic circuit elements of the scan chain of FIG. 3 in accordance with an exemplary embodiment.

Processor 101 may next cycle through each of the remaining latches in scan chain 300 to group together other groups of latches that best meet the objective function of minimizing bounding area. Referring now to FIG. 5, processor 101 may determine that another group of latches L6 314 and L7 316 satisfy the objective function, remove an intervening virtual diagnostic circuit element (not shown), and form super-segment 502.

Figure 6:
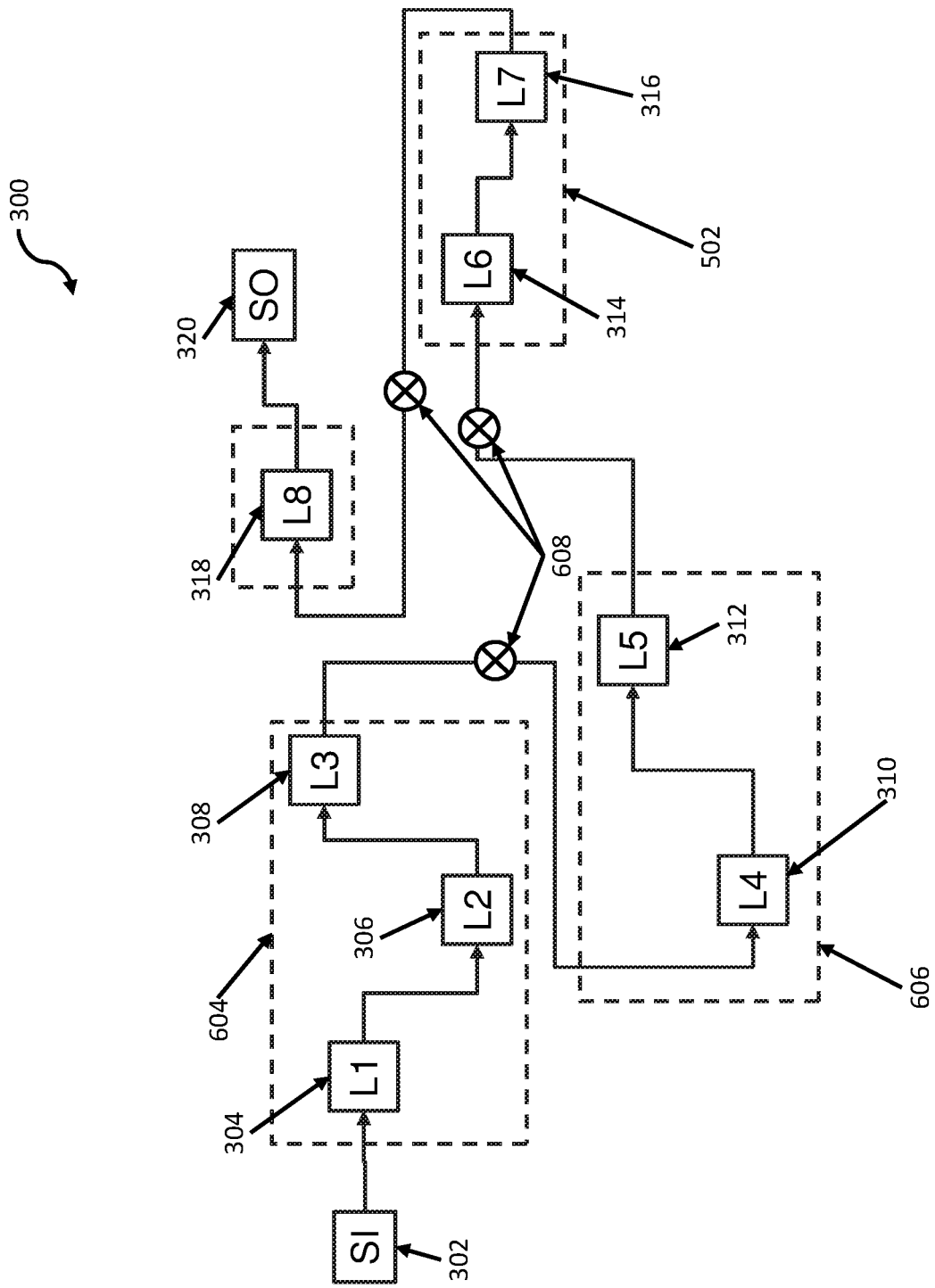
FIG. 6 depicts a block diagram of physically aware insertion of diagnostic circuit elements the scan chain of FIG. 3 in accordance with an exemplary embodiment.

Referring now to FIG. 6, processor 101 may determine that an optimal super-segment 604 should now include latch L1 304, and may group latches L4 310 and L5 312 to form super-segment 606. Accordingly, processor 101 may repeat identifying and merging until a predetermined rule is satisfied. Stated in other terms, processor may stop when the creation of another super-segment in a scan chain breaks a predetermined rule established for the particular objective function.

For example, a predetermined rule may state that a super segment may not exceed an area of 150 microns. If the addition of any segments or super-segments to super-segment 606 breaks the predetermined rule, then processor 101 may analyze the remaining segments and super-segments until it has determined that any more merges would break the predetermined rule. Once processor 101 terminates the merging process, processor 101 may insert one or more logic circuit elements 608 (e.g., XORs) between each remaining virtual segment block to create actual segments on the physical chip. Insertion of logic circuit elements 608 may allow diagnostic isolation of the scan chain segments.

According to some embodiments, processor 101 can instantiate a priority queue to keep adjacent segment pairs ordered by combined area for logarithmic time (e.g., O(log n)) operations. In some aspects, the largest cost may likely be the O(n) time required to build the initial heap.

Figure 7:
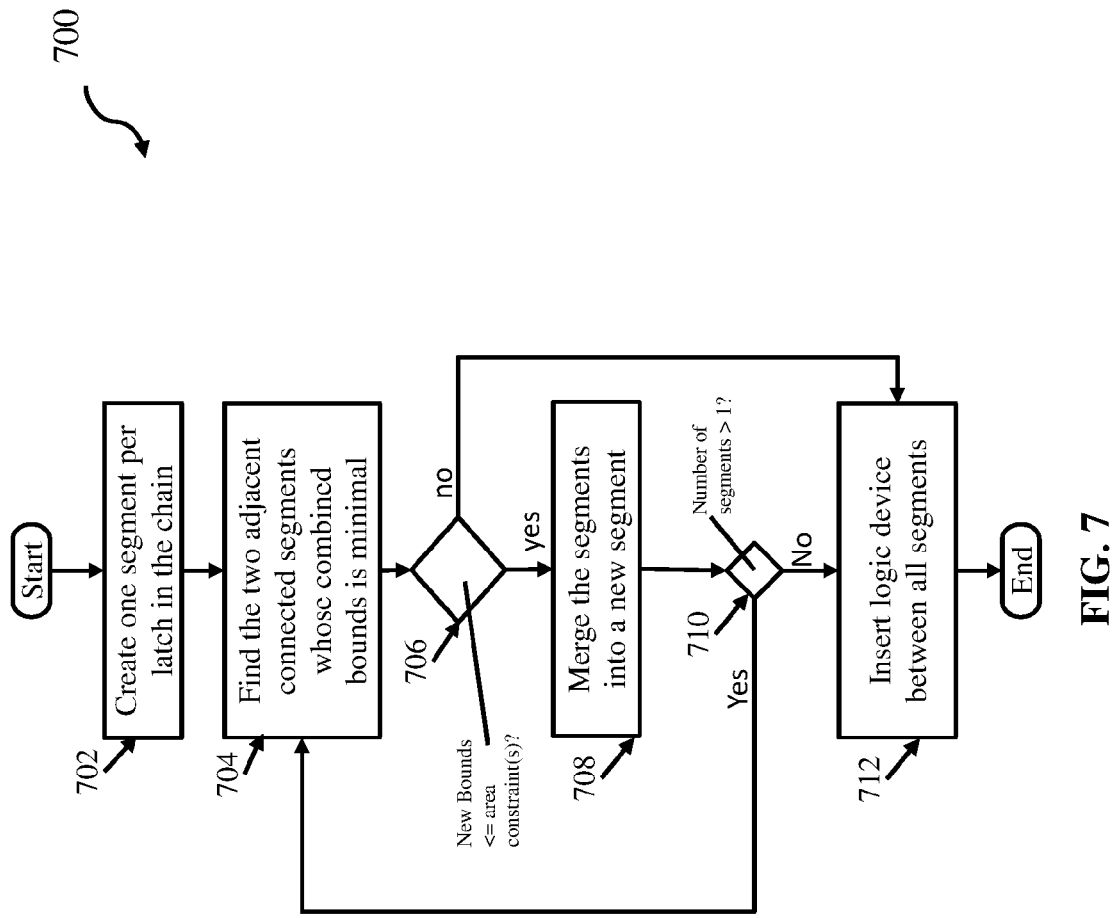
FIG. 7 depicts a flow diagram of an algorithm for physically aware sequential insertion of diagnostic circuit elements in accordance with an exemplary embodiment.

Referring now to FIG. 7, a block diagram of an algorithm 700 for physically aware sequential insertion of diagnostic circuit elements is depicted, in accordance with an exemplary embodiment. As seen in block 702, processor 101 may create a segment 303 for each latch 304-318 in chain 300. Next, processor 101 may find the two adjacent connected segments having a minimal combined bounding area, as shown in block 704. As seen in decision block 706, processor may determine whether new bounds of a theoretically combined super-segment (e.g., super-segment 402) are less than or equal to a predetermined rule for area constraints. If the new bounds are less than or equal to the area constraints in the predetermined rule (e.g., the rule would not be broken), as shown in decision block 706, processor 101 may merge the segments into a new segment, as shown in block 708. If processor 101 determines at decision block 706 that the new bounds area is not less than or equal to the area constraint, then processor 101 may omit the merge step of block 708 and directly insert a logic device between segments, as shown in block 712. Accordingly, processor 101 may iterate through each of the remaining segments and/or super-segments until, as seen in block 710, processor 101 determines that there are no more additional segments in the scan chain to analyze.

Figure 8:
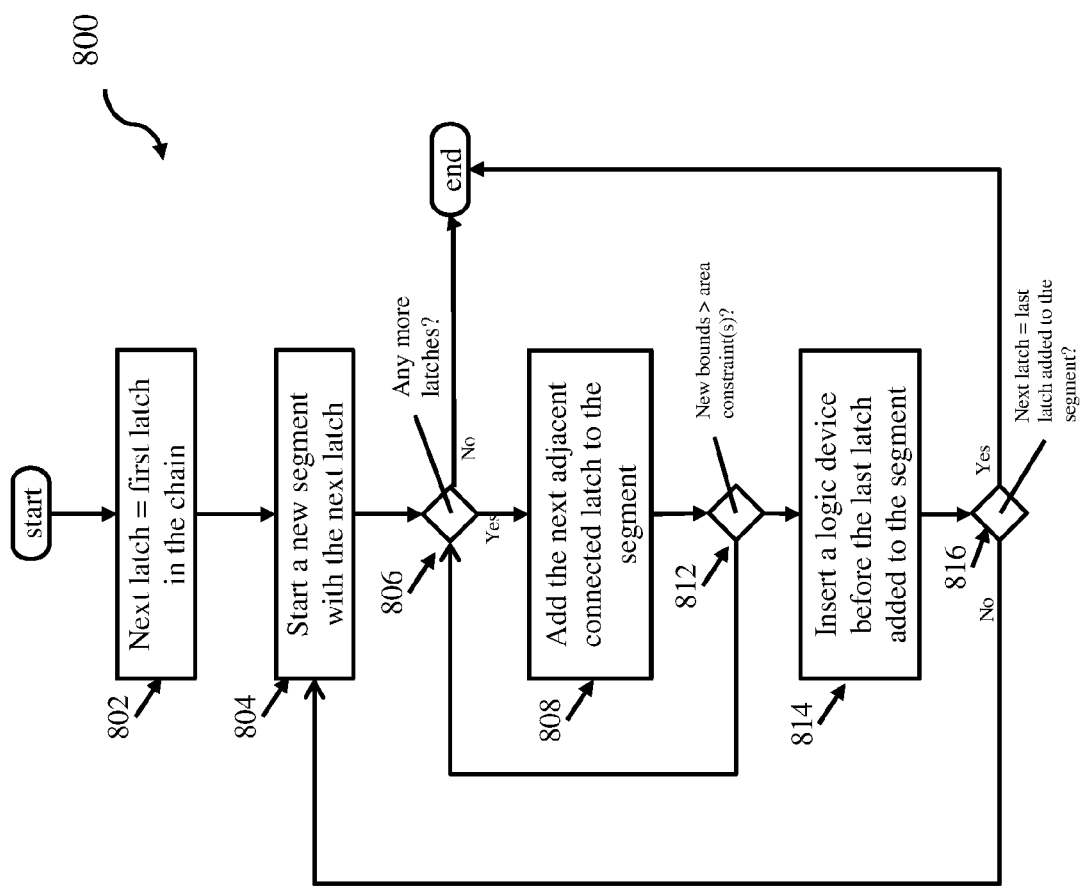
FIG. 8 depicts a flow diagram of an algorithm for sequentially inserting diagnostic circuit elements on a scan chain of a chip in accordance with an exemplary embodiment.

FIG. 8 depicts a flow diagram of an algorithm 800 for sequentially inserting diagnostic circuit elements on a scan chain of a chip, in accordance with an exemplary embodiment. In some aspects, instead of working top-down and seeing the entire scan chain in advance, it may be advantageous for processor 101 to discover the chain from the input pin automatically. In some aspects, processor 101 may discover the chain based on a predetermined rule. For example, processor 101 may use an objective function as described above, and determine whether a predetermined rule associated with the objective is violated.

Referring now to FIG. 8, as shown in block 802, processor 101 may start at a first latch (e.g., starting latch SI 302 shown with respect to FIG. 3), and create a segment for a first latch L1 304. As shown in block 804, processor 101 may start a new segment with the next latch, and add the next adjacent connected latch to the segment (as shown in block 808) if processor determines at decision block 806 that there is another sequential latch available in the scan chain. At decision block 812, processor 101 may determine whether the predetermined rule is violated (e.g., whether the new theoretical area bounds are less than the predetermined constraint area). As shown in block 814, processor 101 may insert a logic device before the last latch added to the segment if the constraint is not violated. Next, as shown in decision block 816, processor 101 may determine if there are any remaining latches, and iteratively continue until the end latch of the scan chain is reached.

Figure 9:
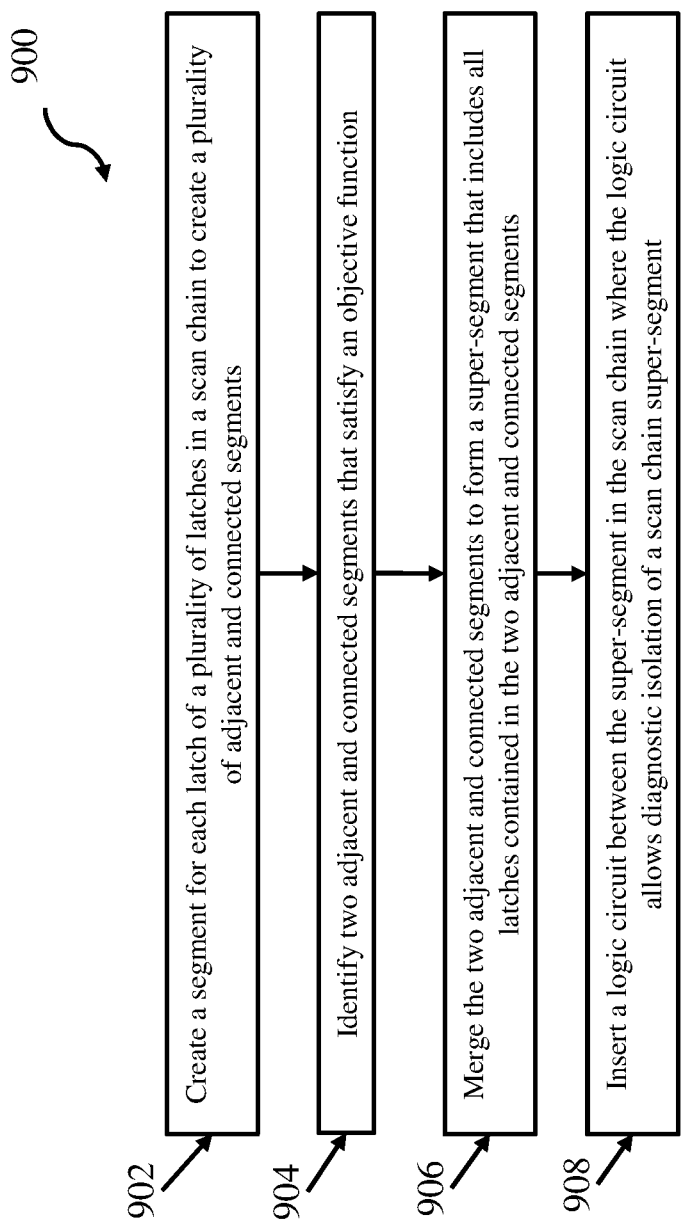
FIG. 9 depicts a flow diagram of a computer-implemented method for inserting diagnostic circuit elements on a scan chain of a chip in accordance with an exemplary embodiment.

FIG. 9 depicts a flow diagram of a computer-implemented method 900 for inserting diagnostic circuit elements on a scan chain of a chip, in accordance with an exemplary embodiment. Referring now to FIG. 9, as shown in block 902, processor 101 may create a segment for each latch of a plurality of latches 304-318 in a scan chain 300 to create a plurality of adjacent and connected segments. As shown in block 904, processor 101 may identify two adjacent and connected segments that satisfy an objective function (e.g., super-segment 402). Processor 101 may then merge the two adjacent and connected segments/latches (e.g., latch L1 304 and latch L2 308) to form a super-segment 402 that may include all latches contained in the two adjacent and connected segments latch L1 305 and latch L2 308. Processor 101 can repeat the steps described with respect to blocks 904 and 906 until a predetermined rule would be broken with the next merge. As shown at block 908, responsive to determining that the predetermined rule is not broken, processor 101 may insert a logic circuit 608 between the super-segment in scan chain 300 where the logic circuit 608 allows diagnostic isolation of a scan chain super-segment (e.g., isolation of super-segments 604, 606, 502, segment 318, etc.).

Figure 10:
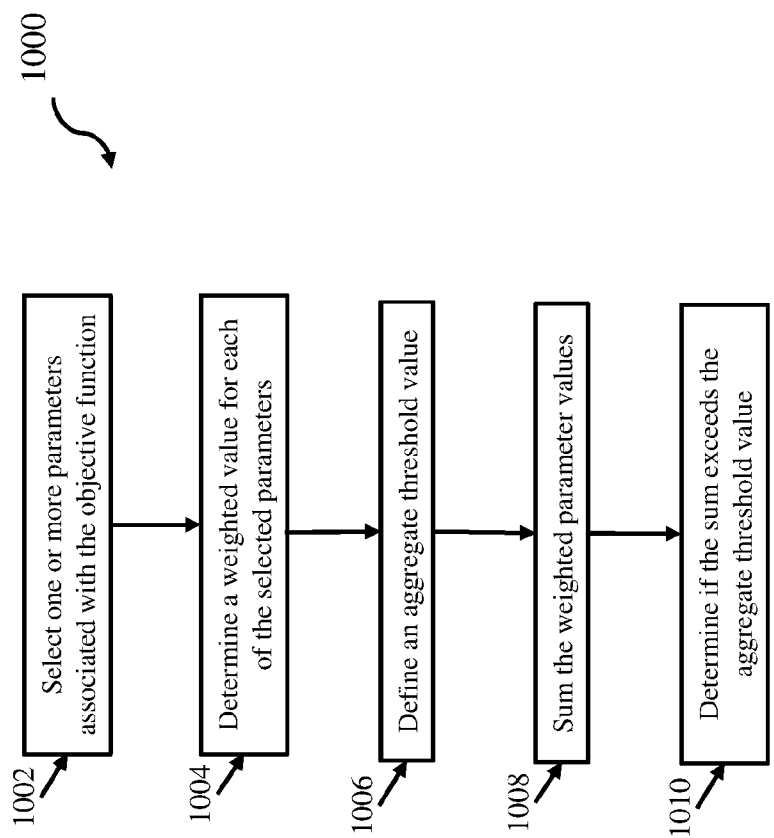
FIG. 10 depicts a flow diagram for a computer-implemented method for creating an optimized objective function in accordance with an exemplary embodiment.

FIG. 10 depicts a method 1000 for creating an optimized objective function, in accordance with an exemplary embodiment. As shown in block 1002, processor 101 may select one or more parameters associated with the objective function. As shown in block 1004, processor 101 may determine a weighted value for each of the one or more parameters selected, and define an aggregate threshold value, as shown in block 1006. The aggregated threshold value may be a value that should not be exceeded by the sum of weighted parameter values. For example, if more than one parameter value is selected by a user, processor 101 may request user input regarding weighted values with respect to each of the selected parameters. Accordingly, processor 101 may attribute a weighted value to each selected parameter based on the user input, add up an aggregated score of the weighted values, as shown in block 1008, and determine if the sum exceeds the aggregate threshold value (as shown in block 1010). Accordingly, processor 101 may assign a heavier weight with respective objectives, and group scan chain elements accordingly. Typically, weights for each parameter could be specified by a user based on the extent to which they cared about a parameter (eg. 80% area, 20% latch count, etc., if the user cared strongly about meeting the area objective).

Figure 11:
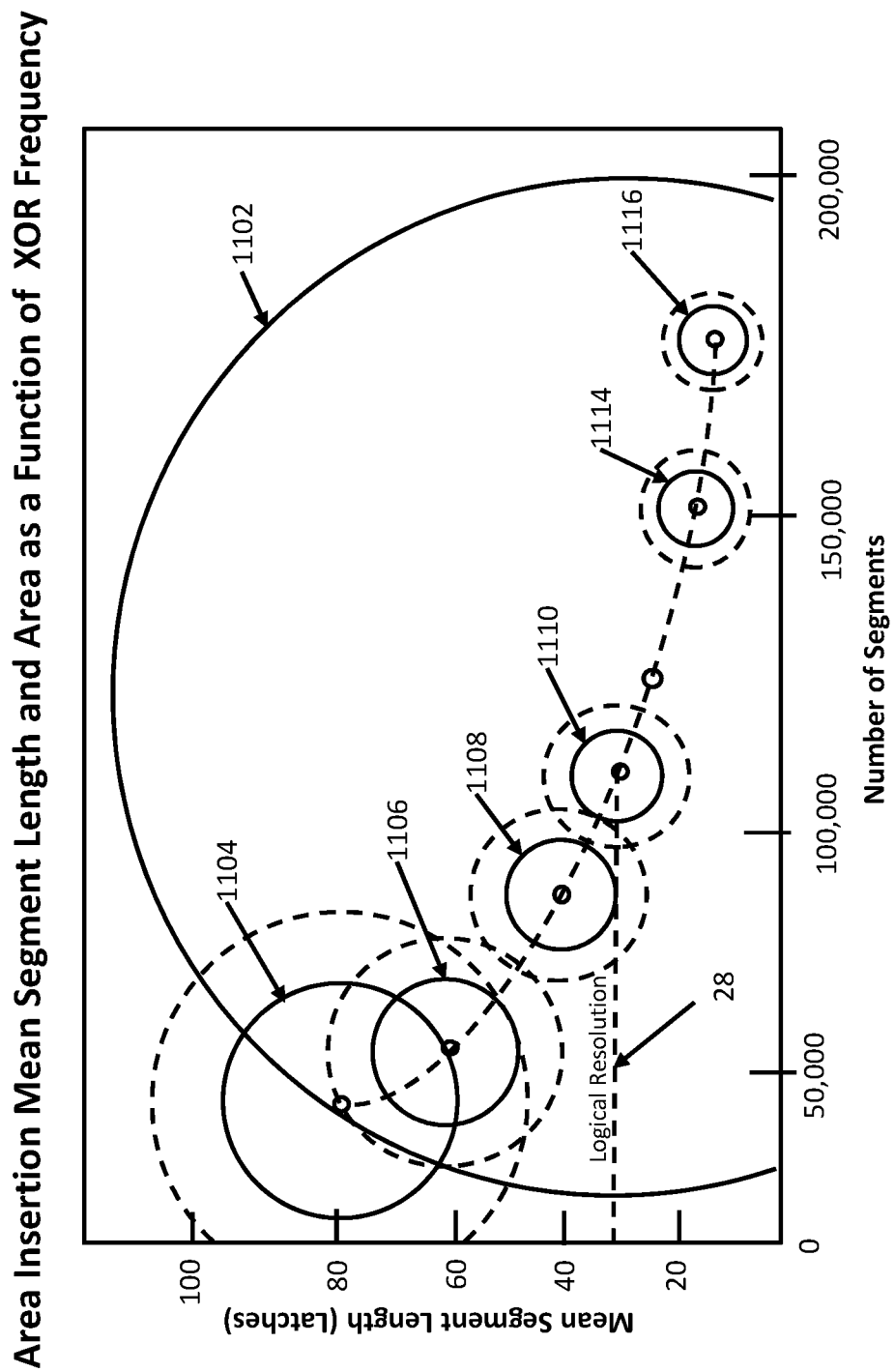
FIG. 11 is a graph of area insertion mean segment length and area as a function of XOR frequency, according to some embodiments.

Referring now to FIG. 11, a graph of area insertion mean segment length and area as a function of XOR frequency is depicted, according to some embodiments. The graph shows potential physical resolution opportunities when diagnostic circuits are placed with spatial awareness. The large circle 1102 in the plot represents actual insertion properties for a 22 nm server product. The solid inner circles represent exemplary resolutions 1104, 1106, 1108, 1110, 1112, 1114 and 1116, which may be average spatial resolutions for particular segment lengths, while the outer "halo" circles depicted in dashed lines surrounding each of resolutions 1104-1116 represent spatial resolution maximums for each respective inner circle. Again, the logical resolution is the average number of devices that a logical element can identify. According to some embodiments described herein, analysis was conducted with different area constraints from 40×40 to 200×200 microns. Resolution 1116 shows a square area of 40×40 microns, resolution 1114 depicts 50×50, resolution 1110 shown 75×75 microns, resolution 1108 depicts 100×100 microns, resolution 1106 depicts 150×150 microns, and resolution 1104 depicts 200×200 microns. As shown in the graph of FIG. 11, according to some exemplary embodiments, some physically aware optimization algorithms can reach roughly the same logical resolution while vastly reducing average and maximum spatial resolution using fewer insertions (x-axis). The dramatic reduction in care area can result in improved diagnostic localization, faster circuit analysis turn-around, reduced expense, and improved yield learning rates.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions IBM Confidential; Attorney Work Product; Attorney Client Privileged Aug. 24, 2015 D-2 by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The IBM Confidential; Attorney Work Product; Attorney Client Privileged Aug. 24, 2015 C-2 terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for inserting diagnostic circuit elements in a scan chain of a chip comprising:
    creating, via a processor, a segment for each latch of a plurality of latches in the scan chain to create a plurality of adjacent and connected segments;
    merging, via the processor, the two adjacent and connected segments to form a super-segment comprising all latches contained in the two adjacent and connected segments based on an objective function, wherein the objective function comprises a predetermined rule;
    analyzing a placement of the segment to identify two adjacent segments that satisfy the objective function comprises:
        selecting, via the processor, at least one parameter from a plurality of parameters associated with the objective function;
        determining, via the processor, a weighted value for each of the at least one parameter;
        defining an aggregate parameter threshold value; and
        determining, via the processor, whether a sum of the weighted values for the at least one parameter is greater than the aggregate parameter threshold value; and
    inserting, via the processor, a logic circuit element between the super-segment and a segment that is adjacent and connected to the super-segment in the scan chain, wherein the logic circuit element allows diagnostic isolation of the scan chain super-segment.

2. The computer-implemented method of claim 1, comprising identifying, via the processor, two adjacent and connected segments that optimally satisfy an objective function by determining a local minima and maxima across the scan chain.

3. The computer-implemented method of claim 1, comprising identifying, via the processer, a next adjacent and connected segment that satisfies an objective function.

4. The computer-implemented method of claim 1, further comprising:
    determining, via the processor, whether a predetermined rule is broken; and
    responsive to determining that the predetermined rule is not broken, inserting the logic circuit element between the super-segment and the segment that is adjacent and connected to the super-segment.

5. The computer-implemented method of claim 1, wherein the plurality of parameters for optimizing the objective function comprises a segment area.

6. The computer-implemented method of claim 1, wherein the plurality of parameters for optimizing the objective function comprises an area by metal level.

7. The computer-implemented method of claim 1, wherein the plurality of parameters for optimizing the objective function comprises a maximum wire length.

8. The computer-implemented method of claim 1, wherein the plurality of parameters for optimizing the objective function comprises a maximum count of elements.

9. The computer-implemented method of claim 1, wherein the plurality of parameters for optimizing the objective function comprises a total iteration count.

10. A system for inserting diagnostic circuit elements on a scan chain of a chip comprising:
    a processor configured to:
        create a segment for each latch of a plurality of latches in the scan chain to create a plurality of adjacent and connected segments;
        merge the two adjacent and connected segments based on an objective function to form a super-segment comprising all latches contained in the two adjacent and connected segments, wherein the objective function comprises a predetermined rule;
        select at least one parameter from a plurality of parameters associated with the objective function;
        determine a weighted value for each of the at least one parameter;
        define an aggregate parameter threshold value; and
        determine whether a sum of the weighted values for the at least one parameter is greater than the aggregate parameter threshold value; and
        analyze a placement of the segment to identify two adjacent segments that satisfy the objective function; and
        insert a logic circuit element between the super-segment and a segment that is adjacent and connected to the super-segment in the scan chain, wherein the logic circuit element allows diagnostic isolation of a scan chain super-segment.

11. The system of claim 10, comprising identifying, via the processor, two adjacent and connected segments that optimally satisfy an objective function by determining a local minima and maxima across the scan chain.

12. The system of claim 10, comprising identifying, via the processer, a next adjacent and connected segment that satisfies an objective function.

13. The system of claim 10, wherein the processor is configured to:
   determine whether a predetermined rule is broken; and
   responsive to determining that the predetermined rule is not broken, insert the logic circuit element between the super-segment and the segment that is adjacent and connected to the super-segment.

14. The system of claim 10, wherein the plurality of parameters for optimizing the objective function comprises a segment area.

15. The system of claim 10, wherein the plurality of parameters for optimizing the objective function comprises an area by metal level.

16. The system of claim 10, wherein the plurality of parameters for optimizing the objective function comprises one or more of a maximum wire length, a maximum count of elements and a total iteration count.

17. A non-transitory computer-readable storage medium having program instructions embodied therewith, the program instructions executable by a processor to cause the processor to perform a method for inserting diagnostic circuit elements on a scan chain of a chip, the method comprising:
   creating, via the processor, a segment for each latch of a plurality of latches in the scan chain to create a plurality of adjacent and connected segments;
   merging, via the processor, the two adjacent and connected segments to form a super-segment comprising all latches contained in the two adjacent and connected segments based on an objective function, wherein the objective function comprises a predetermined rule;
   analyzing a placement of the segment to identify two adjacent segments that satisfy the objective function comprises:
      selecting, via the processor, at least one parameter from a plurality of parameters associated with the objective function;
      determining, via the processor, a weighted value for each of the at least one parameter;
      defining an aggregate parameter threshold value; and
      determining, via the processor, whether a sum of the weighted values for the at least one parameter is greater than the aggregate parameter threshold value;
   grouping latches based on a timing element type; and
   inserting, via the processor, a logic circuit between the super-segment and a segment that is adjacent and connected to the super-segment in the scan chain, wherein the logic circuit allows diagnostic isolation of the scan chain super-segment.

18. The non-transitory computer-readable storage medium of claim 17, further comprising:
   determining, via the processor, whether a predetermined rule is broken; and
   responsive to determining that the predetermined rule is not broken, inserting the logic circuit element between the super-segment and the segment that is adjacent and connected to the super-segment.

* * * * *